Jan. 3, 1967 A. J. LEARN ET AL 3,296,456

HIGH GAIN CRYOTRON

Filed Oct. 9, 1963 3 Sheets-Sheet 1

ARTHUR J. LEARN
RUEBEN S. SPRIGGS
INVENTORS

BY Jerry A. Dinardo

AGENT

INVENTORS
ARTHUR J. LEARN
RUEBEN S. SPRIGGS
BY Jerry A. Dinardo
AGENT

HIGH GAIN CRYOTRON

Filed Oct. 9, 1963

3 Sheets-Sheet 3

ARTHUR J. LEARN
RUEBEN S. SPRIGGS
INVENTORS

BY Jerry A. Dinardo

AGENT

United States Patent Office 3,296,456

Patented Jan. 3, 1967

3,296,456

HIGH GAIN CRYOTRON

Arthur J. Learn, Torrance, and Rueben S. Spriggs, San Pedro, Calif., assignors to TRW Inc., a corporation of Ohio Filed Oct. 9, 1963, Ser. No. 315,074
6 Claims. (Cl. 307—88.5)

This invention relates to cryotrons generally and more particularly to improvements designed to increase the "efficiency" of thin film cryotron circuit elements and the operating speed of circuits employing thin film cryotrons.

One form of thin film cryotrons may consist of a superconductive thin film control element insulated from and crossing at right angles with a superconductive thin film gate element. For a small gate current, when the control current is below a certain critical level the gate element is in a superconducting or zero resistance state. When the control current is in excess of the critical current, a sufficient magnetic field is created to render the gate element nonsuperconducting or resistive.

Such a cryotron finds use as a gating or switching device. For example, flip-flop circuits may be constructed in which cryotrons are arranged in each of two electrically parallel branches. A current applied to the junction of the two branches may be switched in one or the other branch by switching the cryotrons oppositely on and off. It can be shown that the speed with which the current may be switched between the two branches is proportional to the square of the "efficiency" of each cryotron. As used herein "efficiency" represents the ratio between the critical self-field (field due to a critical self-current) and the critical external field required to quench the superconductivity of the gate film. Accordingly, for high speed, the "efficiency" of the cryotron should be high.

It is also known that the "efficiency" E of a cryotron is equal to the ratio of the threshold gate current $I_t$ at which resistance first appears in the gate element in the absence of control current, divided by gate width $W_g$, to the control current $I_k$ which renders resistive the entire portion of the gate element directly under the control element for gate currents approaching zero, divided by control width $W_k$. That is, $$E=\left(\frac{I_t/W_g}{I_k/W_k}\right)$$

It is therefore apparent that a high threshold current per unit gate width is necessary to attain high efficiency.

Accordingly, an object of this invention is to increase the efficiency of thin film superconductive cryotrons.

A further object is to provide the gate element of a cryotron with a structure that appreciably increases the threshold gate current per unit gate width.

The foregoing and other objects are achieved according to the invention by imparting to the gate element a structure of irregular thickness. The irregularities in thickness are such as to produce what are believed to be many filamentary conductors extending along the length of the gate element. The filamentary structure is believed to give rise to many current conduction paths of generally mesa-shaped cross sections, the whole gate element structure being capable of passing more current, before a transition to the resistive state occurs, than would the same volume of material were it of uniform thickness. The threshold current per unit width of films proproduced with irregular thickness can be increase by a factor of over two as compared to films which are substantially of uniform thickness.

Figure 5:
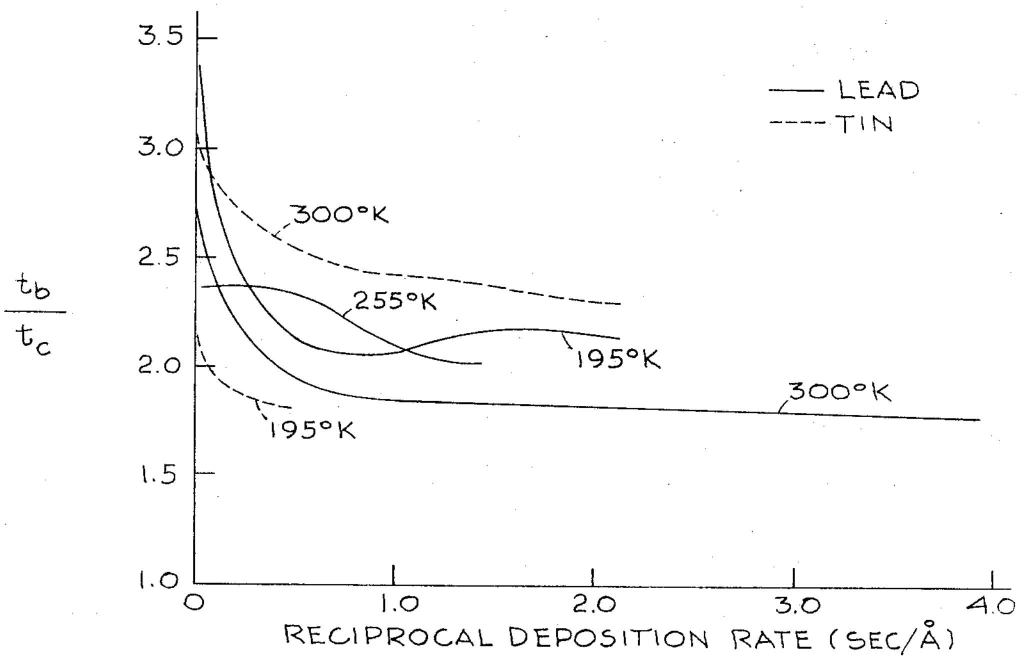
Figure 6:
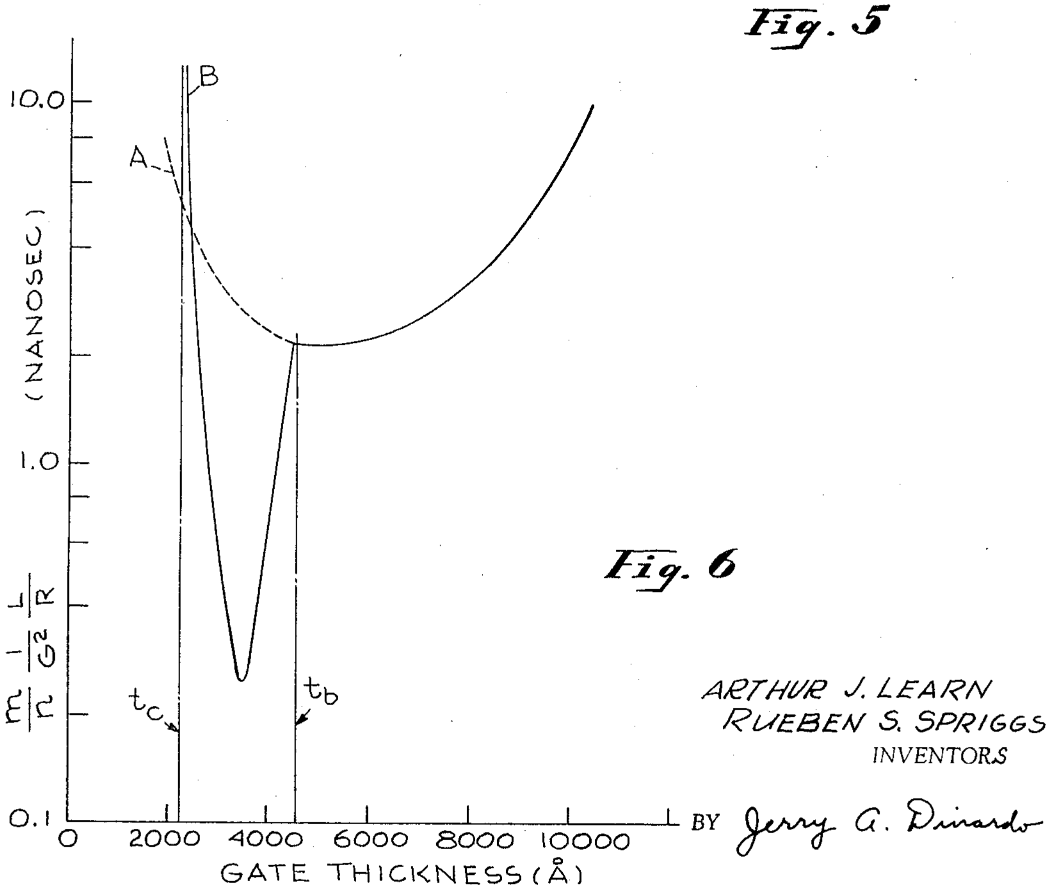

FIG. 5 is a graph showing the variation in the ratio of the thickness at which the conductance of a superconductive film becomes linear with thickness to the thickness at which electrical conduction first occurs, as a function of the reciprocal deposition rate; and FIG. 6 is a graph showing the variation in the reciprocal of the gain squared-bandwidth product as a function of the thickness of the gate element of a cryotron.

Figure 1:
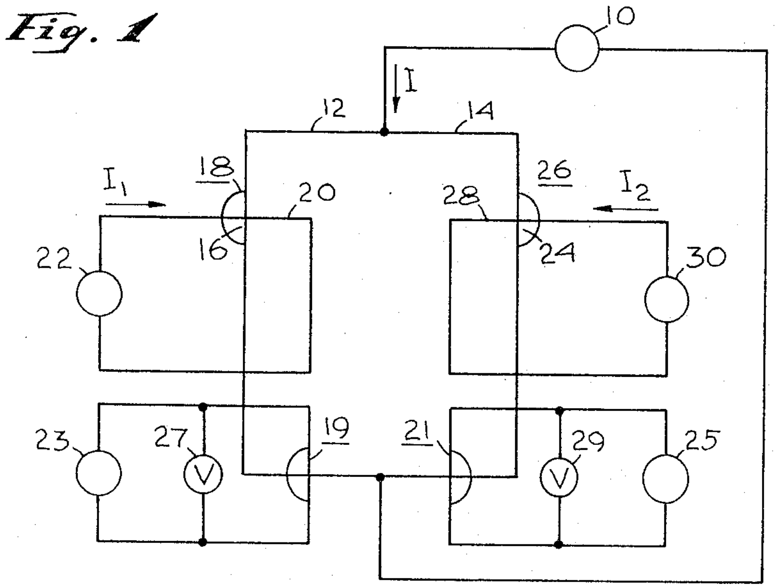
FIG. 1 is a schematic diagram of a flip-flop circuit employing cryotrons as the switching elements.

Referring to FIG. 1, which shows a flip-flop circuit employing superconductive thin film cryotrons, a supply current I from a generator 10 is fed to the junction of two electrically parallel branches 12 and 14. Connected in series in one branch 12 is the gate element 16 of a cryotron 18. The control element 20, which crosses the gate element 16 at right angles, is fed a control current $I_1$ from a generator 22. A detailed discussion of the crossed-film cryotron is contained in an article by V. L. Newhouse, J. W. Bremer, and H. A. Edwards, entitled "Physics and Characteristics of the Crossed-Film Cryotron—A Review," published in the journal Solid State Electronics, Pergamon Press, vol. 1, No. 4, September 1960, p. 261.

Connected in series in the other branch 14 is the gate element 24 of a cryotron 26. The control element 28 of this cryotron 26 is fed a current $I_2$ from a generator 30. The control current $I_1$ and $I_2$ are each greater than the critical value $I_k$ necessary to transform that portion of the gate element directly under the control element, in the absence of gate current.

A sensing cryotron 19 is connected in branch 12 and a sensing cryotron 21 is connected in branch 14. The sensing cryotron 19 is fed current from a generator 23, and the sensing cryotron 21 is fed current from a generator 25. A voltmeter 27 connected across the gate element of cryotron 19 registers a voltage when said gate element is resistive as a result of current flow in branch 12. Likewise, a voltmeter 29 connected across the gate element of cryotron 21 registers a voltage when the latter gate element is resistive as a result of current flow in branch 14.

In the absence of control currents $I_1$ and $I_2$, both gate elements 16 and 24 of cryotrons 18 and 26, respectively, are superconducting. The supply current I from generator 10 will divide in the two branches 12 and 14 inversely proportional to the inductances of the branches. If a control current $I_1$ is applied to the control element 20 and no control current $I_2$ is applied to the control element 28, the gate element 16 of cryotron 18 will be switched resistive, and all of the supply current I will flow through the gate element 24 of cryotron 26. When the control current $I_1$ is turned off, the supply current I will continue to flow through gate element 24.

If a control current $I_2$ is now applied to the control element 28 of cryotron 26 so as to render the gate element 24 resistive, the supply current I will be switched from branch 14 to branch 12. The current I will continue to flow in branch 12 until the control current $I_2$ in control element 28 is turned off and control current $I_1$ in control element 20 is turned on. Thus it can be seen that the series current I can be switched between the two branches 12 and 14 by controlling the currents $I_1$ and $I_2$ applied to the control elements 20 and 28. The current in branches 12 and 14 are sensed by the sense cryotrons 19 and 21. In general, the switching time constant for transfer of current between branches of a superconductive loop is given by the following expression:

$$\frac{L}{R}=\frac{4\pi\times10^{-7}nl_k t_s/W_k}{m\rho l_g/W_g t_g}$$

where

L is the inductance of the entire loop
R is the restored resistance in one branch of the loop
$t_g$ is the gate thickness
$t_s$ is the gate thicknes+2 thicknesses of insulation+penetration depth in control+penetration depth in ground plane
$l_k$ is the length of the control
$W_k$ is the control width
$\rho$ is the resistivity of the gate material
$l_g$ is the length of the gate
$W_g$ is the gate width
$n$ is the number of controls in the loop
$m$ is the number of resistive gates in series in one branch of the loop.

It is assumed for simplicity that the inductance in the loop is substantially that of the control films in the loop and all cryotrons are identical.

If in addition by proper mask design there results:

$$l_k=W_g \text{ and } l_g=W_k$$

$$\frac{L}{R}=4\pi\times10^{-7}\frac{n}{m}\left(\frac{t_s t_g}{\rho}\right)\left(\frac{W_g}{W_k}\right)^2$$

In the example under consideration, i.e. the circuit of FIG. 1, the loop formed by branches 12 and 14 has $n=2$ and $m=1$ in this expression. Both for this special case and generally, it is of course, desirable to make the switching time constant $L/R$ as small as possible consistent with a chosen cryotron current gain G. For example in circuits where cryotrons control other cryotrons, (FIG. 1) G must be chosen greater than unity.

The gain G of a cryotron is equal to the threshold gate current $I_t$ divided by the critical control current $I_k$, or $I_t/I_k$, which is also equal to $$E\left(\frac{W_g}{W_k}\right)$$

The threshold current $I_t$ is the least value of gate current which causes some resistance to appear in the gate element, with no control current applied. The critical control current $I_k$ is the least value of control current which causes the entire width portion of the gate element directly adjacent to the control element to go resistive for gate currents approaching zero. It is apparent from the expressions for $L/R$ and G that if E can be increased, for a given gate film thickness, then $(W_g/W_k)$ may be reduced by the same factor, thus maintaining a given value for G and reducing $L/R$ by the square of this factor. Additionally, it can be seen that a high threshold gate current $I_t$ per unit gate width will result in a high efficiency E. This is perhaps more easily seen by combining the expressions for $L/R$ and G to obtain $$\frac{m}{n}\frac{l}{G^2}\frac{L}{R}=4\pi\times10^{-7}t_s t_g/\rho E^2$$

For a given G, switching time is clearly seen to depend inversely upon the square of efficiency which in turn depends directly on threshold current per unit gate width. Also, $L/R$ depends inversely upon the resistivity of the gate film material.

Figure 2:
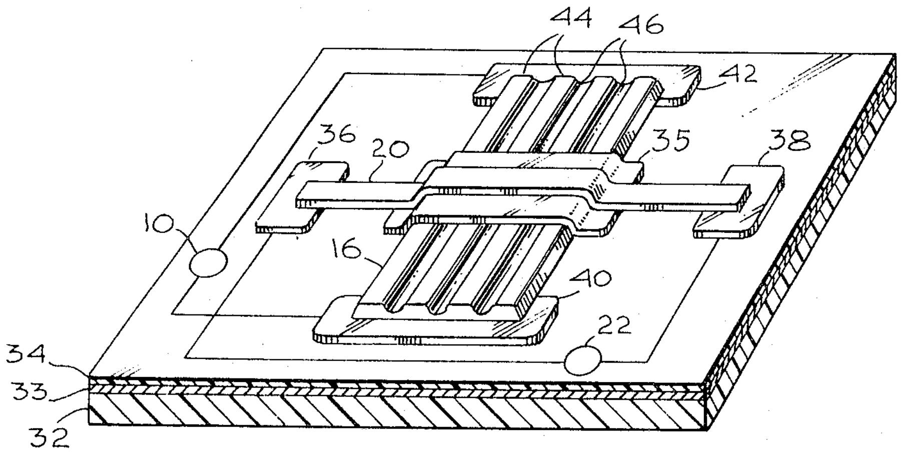
FIG. 2 is an enlarged perspective view, partly schematic, of a cryotron having a gate element constructed according to the invention.

According to the invention, the thereshold gate current $I_t$ per unit width is increased by forming the film making up the gate element in a structure which has widely varying thickness irregularities. Reference is now made to FIG. 2 which shows an enlarged perspective view of a thin film cryotron such as cryotron 18, having a gate element constructed with surface irregularities according to the invention. A substrate 32 is provided with a superconductive ground plane coating 33 and an insulating film 34. The gate element 16 is disposited on the insulating film 34, a second insulating film 35 is deposited on the second insulating film 35 transverse to the gate element 16. The control element 20 is provided with terminals 36 and 38 to which generator 22 is connected and the gate element has terminals 40 and 42 across which generator 10 is connected.

As shown in FIG. 2, the gate element 16 is formed with many surface irregularities of varying thickness. Preferably these surface irregularities, when viewed along the width of the gate element, are in the form of alternate crests 44 and valleys or depressions 46. When viewed along the length of the gate element 16, the surface irregularities constitute a multiplicity of filaments each of which forms a continuous current conducting path between the terminals 40 and 42. While the filaments are preferably shown as being substantially straight, this is difficuffilt to achieve in practice, and in fact they may extend along rather tortuous paths, and may even cross one another. In cross section, they are believed to be generally mesa-shaped as shown.

Figure 3:
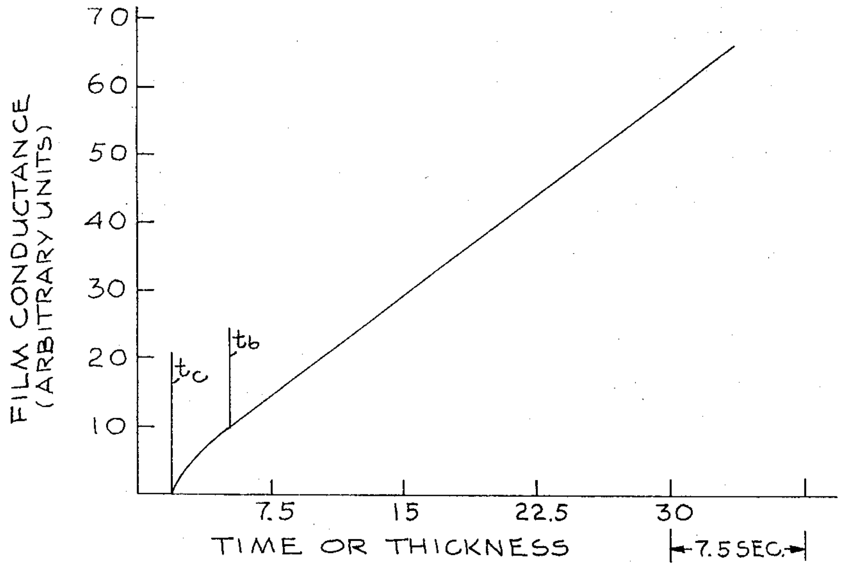
FIG. 3 is a graph showing the variation in the conductance of a superconductive thin film as a function of the thickness during vacuum deposition thereof.

FIG. 3 is a graph showing the variation in the conductance of a vacuum deposited thin superconductive film as a function of deposition time. Since the deposition rate was held constant at 85 angstroms per second, the abscissa could also be taken as the film thickness. The actual curve shown is for lead deposited on a quartz substrate held at 255° K. However, similar curves are obtained for other superconductive metals and other substrate temperatures. As shown in the graph, no appreciable conductance is observable in the film until it reaches a critical thickness $t_c$, due to a lack in continuity through the film. More precisely, $t_c$ defines the thickness at which the film conductance increase rapidly with the addition of each monolayer. Over a range of thicknesses between $t_c$ and a thickness $t_b$, the conductance increases with decreasing slope for the curve. For thicknesses greater than $t_b$ the conductance curve is linear. The thicknesses $t_c$ and $t_b$ depend markedly on deposition rate and substrate temperature.

It has been found that when a film is made with a thickness lying between $t_c$ and $t_b$, it will be found to have the desired irregular surface variations which cause it to exhibit high threshold current $I_t$ per unit gate width for cryotron operation. In all the many films tested, it has been found that the thickness $t_b$ is two to three times the value of $t_c$. It has also been found that films having a thickness of $t_c$ or greater exhibit less than 15% light transmission, as measured by an optical densitometer. The transmission falls off to zero at a thickness $t_b$, at which point there are no longer any voids in the film. When a film has a thickness greater than $t_b$, it loses its filamentary structure and it no longer has wide thickness variations, due to the filling in of the valleys 46 between the creast portions 44 (FIG. 2). At these greater thicknesses the film behaves like conventional gate elements, with the threshold currents per unit gate width being substantially identical.

Figure 4:
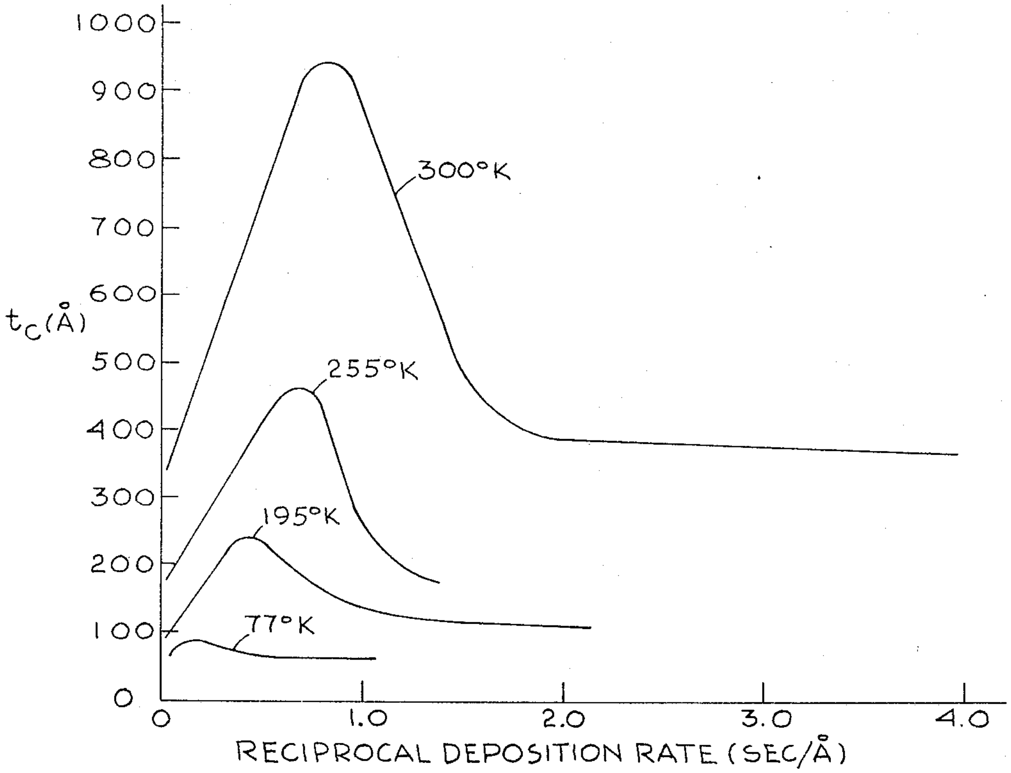
FIG. 4 is a graph showing the variation in the minimum thickness at which electrical conduction first occurs in a superconductive thin film as a function of the reciprocal deposition rate of the film.

The behavior of film conductance over a wide range of deposition rate and substrate temperature tested is shown in the graphs of FIGS. 4 and 5. While the curves shown in FIG. 4 were obtained for a lead film, similar curves have been obtained for other metals. In FIG. 4, the critical thickness $t_c$ is displayed as a function of reciprocal deposition rate at four substrate temperatures, namely 77° K., 195° K., 255° K., and 300° K. All curves appear to have a finite zero intercept on the thickness axis at very large deposition rates (reciprocal deposition rate approaching zero). There is an initial increase in the critical thickness $t_c$ with increasing reciprocal deposition rate, after which each curve passes through a maximum and then levels off at a value near its zero intercept for large values of reciprocal deposition rate.

In general, as the substrate temperature is increased it causes the critical thickness to shift to larger values at a given reciprocal deposition rate.

In FIG. 5, the ratio of $t_b$ to $t_c$ is plotted as a function of reciprocal deposition rate. The solid curves are for lead and the dashed line curves are for tin. It can be seen that the ratio of $t_b$ to $t_c$ lies approximately between 2 and 3 for both materials at all substrate temperatures.

Referring again to the graph of FIG. 4, if the results at 77° K. are excepted, for values of reciprocal deposition rate somewhat less than the maximum value, the critical thickness $t_c$ is given to a good approximation by:

$$t_c=(A+dB)\epsilon\frac{-E}{RT}$$

where

R is the universal gas constant in cal./mole-deg. absolute
$d$ is the reciprocal deposition rate in sec./angstrom
T is the absolute temperature of the substrate, and
A, B, and E are constants characteristic of a given evaporant-substrate combination.

The following table gives values of the constants A, B, and E for lead and tin:

| Material | A (A.) | B (A.² /sec.) | E (kcal./mole) |
|---|---|---|---|
| Lead | $5.5\times10^3$ | $2.0\times10^4$ | 1.8 |
| Tin | $1.0\times10^4$ | $1.5\times10^5$ | 2.0 |

When the gate element of a cryotron is fabricated with a filamentary structure according to the invention, there is a substantial reduction in the reciprocal of the gain squared bandwidth product $$\frac{m}{n}\frac{l}{G^2}\times\frac{L}{R}$$

which determines circuit switching time constant as discussed previously. The graph of FIG. 6 clearly illustrates this for indium gate elements having a width of 480 microns in combination with lead control elements having a width of 25 microns. Cryotrons were maintained at a temperature of 3.20° K.

Curve A is plotted for conventional gate elements and curve B is plotted for gate elements having a filamentary structure according to the invention. The curves show the variation in $$\frac{m}{n}\frac{l}{G^2}\times\frac{L}{R}$$

as a function of gate thickness. For each cryotron, the quantity $$\frac{m}{n}\frac{l}{G^2}\times\frac{L}{R}$$

is calculated as $4\pi\times10^{-7}t_st_g/\rho E^2$, by using experimentally determined values in the latter. The curve A for conventional gate elements initially shows a gradual decrease in the function as the thickness is increased with a minimum value being reached in a broad thickness range between 4000 and 6000 angstroms, and then a gradual increase at larger thicknesses. The curve B, however, shows significantly different behavior for thicknesses less than $t_b$. This is associated with the differing film structure for the gate elements at thicknesses less than $t_b$. The value at the minimum in curve B is an order of magnitude smaller than the minimum in curve A. The minimum in curve B is the result primarily of the increased efficiency E, or $$\frac{(I_t/W_g)}{(I_k/W_k)}$$

However, the resistivity $\rho$ for films made in accordance with the invention is also increased, due to the thickness variations.

It is well known for conventional cryotrons that the efficiency E increases with decreasing operating temperature. This is also found to be true for cryotrons having films according to the invention, with the proportionate change in efficiency being the same for both types of elements. Accordingly, the relative minima in the quantity $$\frac{m}{n}\frac{l}{G^2}\frac{L}{R}$$

for both types of elements is substantially independent of temperature.

The embodiments of the invention in which an exclusive property or privilege is claimed are defined as follows:

1. A thin film cryotron comprising:
a thin film superconductive gate element provided with terminals for applying a gate current thereto, and a thin film superconductive control element adjacent to said element and operable in response to current passing therethrough to control the gate current through said gate element by controlling transitions between superconductive and resistive states of said gate element,
said gate element being characterized by
(1) having less than 15% optical transmission
(2) having a filamentary structure formed by longitudinally extending thick crest portions separated by appreciably thinner valley portions, with said crest portions extending and forming unbroken conduction paths between said terminals.

2. The invention according to claim 1, wherein said crest portions are mesa-shaped.

3. A thin film cryotron comprising:
a thin film superconductive gate element provided with terminals for applying a gate current thereto, and a thin film superconductive control element adjacent to said element and operable in response to current passing therethrough to control the gate current through said gate element by controlling transitions between superconductive and resistive states of said gate element,
said gate element being characterized by having wide thickness variations, with the thicker portions forming continuous paths along the length of the gate element between said terminals.

4. A thin film cryotron comprising:
a thin film superconductive gate element provided with terminals for applying a gate current thereto, and a thin film superconductive control element adjacent to said element and operable in response to current passing therethrough to control the gate current through said gate element by controlling transitions between superconductive and resistive states of said gate element,
said gate element being characterized by having surface thickness irregularities formed by a multiplicity of longitudinally extending depressions lying between crest portions that extend continuously between said terminals.

5. A thin film cryotron comprising:
a thin film superconductive gate element provided with terminals for applying a gate current thereto, and a thin film superconductive control element adjacent to said gate element and operable in response to current passing therethrough to control the gate current through said gate element by controlling transitions between superconductive and resistive states of said gate element,
said gate element having an electrical conductance versus thickness characteristic that increases at a decreasing rate between a first thickness below which no appreciable conductance occurs and a second thickness above which the conductance increases linearly;

said gate element being characterized by having a thickness between said first and second thicknesses.

6. A thin film cryotron comprising:

a thin film superconductive gate element provided with terminals for applying a gate current thereto, and a thin film superconductive control element adjacent to said gate element and operable in response to current passing therethrough to control the gate current through said gate element by controlling transitions between superconductive and resistive states of said gate element, said gate element being characterized by having a thickness between a critical value a greater thickness value that is about 2 to 3 times said critical value, the conductance of said gate element for any thickness below said critical value being substantially zero, and said gate element exhibiting a conductance versus thickness characteristic between said critical value and said higher thickness value that increases at a decreasing rate with increasing thickness.

References Cited by the Examiner

Proceedings of the IRE, Thin-Film Cryotrons, Smallman et al.; part II, by Slade, pages 1569 through 1575, September 1960.

ARTHUR GAUSS, *Primary Examiner.*

M. LEE, J. JORDAN, *Assistant Examiners.*